United States Patent [19]

Ryou

[11] Patent Number: 5,550,071
[45] Date of Patent: Aug. 27, 1996

[54] METHOD FOR FORMING MICRO CONTACTS OF SEMICONDUCTOR DEVICE

[75] Inventor: Eui K. Ryou, Kyoungki-do, Rep. of Korea

[73] Assignee: Hyundai Electronics Industries Co., Ltd., Kyoungki-do, Rep. of Korea

[21] Appl. No.: 546,736

[22] Filed: Oct. 23, 1995

[30] Foreign Application Priority Data

Oct. 28, 1994 [KR] Rep. of Korea .................. 94-27927

[51] Int. Cl.$^6$ .................. H01L 21/283; H01L 21/336
[52] U.S. Cl. .................. 437/41; 437/52; 437/193; 437/195; 437/984
[58] Field of Search .................. 437/41 SM, 52, 437/60, 189, 192, 193, 195, 919, 984; 257/382, 752, 754, 758

[56] References Cited

U.S. PATENT DOCUMENTS

| | | | |
|---|---|---|---|
| 5,192,703 | 3/1993 | Lee et al. | 437/52 |
| 5,296,400 | 3/1994 | Park et al. | 437/52 |
| 5,312,768 | 5/1994 | Gonzalez | 437/40 |
| 5,387,532 | 2/1995 | Hamamoto et al. | 437/52 |
| 5,414,302 | 5/1995 | Shin et al. | 257/752 |
| 5,478,772 | 12/1995 | Fazan | 437/60 |

OTHER PUBLICATIONS

Küsters, K., et al., "A Stacked Capacitor Cell with a Fully Self–Aligned Contact Process for High–Density Dynamic Random Access Memories", *J. Electrochem. Soc.* vol. 139, No. 8, Aug. 1992, 2318–2322.

*Primary Examiner*—T. N. Quach
*Attorney, Agent, or Firm*—Morgan & Finnegan, L.L.P.

[57] ABSTRACT

A method for forming micro contacts of a semiconductor device, including the steps of forming a transistor on a semiconductor substrate, forming a pad conductive layer over the resulting structure, forming an insulating film over the resulting structure, thereby planarizing the structure, forming a photoresist film pattern on the planarized structure by use of a contact mask, etching the insulating film using the photoresist film pattern as a mask, thereby partially exposing the pad conductive layer, selectively over-growing the exposed portion of the pad conductive layer, thereby forming a second conductive layer, etching the insulating film using the pad conductive layer as a mask, thereby forming an insulating film pattern, fully etching both the overgrown second conductive layer and the pad conductive layer to a desired depth, filling the etched portions of the conductive layers with another insulating film, thereby planarizing the structure, and forming a bit line on a desired portion of the planarized structure such that the bit line is in contact with the semiconductor substrate. The method according to the present invention can form micro contacts, thereby improving the reliability of the semiconductor device and achieving the high integration of the semiconductor device.

5 Claims, 3 Drawing Sheets

5,550,071

METHOD FOR FORMING MICRO CONTACTS OF SEMICONDUCTOR DEVICE

BACKGROUND OF THE INVENTION

1. Field of the Invention

The present invention relates to a method for forming micro contacts of a semiconductor device, and more particularly to a method for forming micro contacts having a dimension smaller than that of an actual dimension of the contact mask.

2. Description of the Prior Art

Recent high integration trend of semiconductor devices inevitably involves a reduction in unit cell area. For this reason, it has become important to provide techniques for obtaining a process margin.

Using existing techniques and equipment, however, it is difficult to fabricate semiconductor devices with a high integration degree because the techniques and equipment provide an insufficient process margin.

A conventional method for forming contacts of semiconductor devices will now be described.

In accordance with this method, a polysilicon film, which is a conductive layer for a gate electrode, is formed over a semiconductor substrate overlaid with a gate oxide film. Impurity ions are then implanted in the polysilicon film. Using a gate electrode mask, the polysilicon film and gate oxide film are then etched, thereby forming a gate electrode. Thereafter, impurity ions are implanted in the semiconductor substrate under the condition that the gate electrode is used as a mask, thereby defining source/drain junction regions. Over the resulting structure, an insulating layer is formed which provides a planarized surface. Using a contact mask, a photoresist film pattern is formed on a portion of the insulating film corresponding to the active region of the semiconductor substrate. Using the photoresist film pattern as a mask, the insulating film is partially etched, thereby forming a contact hole through which the semiconductor substrate is exposed at its desired portion. Thereafter, another conductive layer is formed on the resulting structure such that it comes into contact with the semiconductor substrate through the contact hole. Thus, a contact is formed.

In accordance with this method, however, a short circuit may occur between the gate electrode and the conductive layer buried in the contact hole because the formation of the contact is achieved by using the contact mask designed in accordance with the least design rule. As a result, the reliability of the semiconductor device is degraded. In order to solve this problem, it is required to increase the distance between neighboring gate electrodes or to reduce the size of the contact mask for forming the contact. Where the distance between neighboring gate electrodes is increased, however, the semiconductor device becomes bulky. In this case, it is impossible to achieve the high integration of the semiconductor device. In the case of reducing the contact mask, it is difficult to obtain a desired pattern because of the limited resolution of the used equipment. In this case, the semiconductor device exhibits a degraded reliance. Furthermore, it is difficult to achieve the high integration of the semiconductor device.

SUMMARY OF THE INVENTION

Therefore, an object of the invention is to provide a method for forming micro contacts of a semiconductor devices, being capable of forming micro contacts having a dimension smaller than that of an actual dimension of the contact mask.

In accordance with the present invention, this object is accomplished by providing a method for forming micro contacts of a semiconductor device, comprising the steps of: forming a gate oxide film on a semiconductor substrate; forming a polysilicon film for a gate electrode over the gate oxide film; forming a first insulating film over the resulting structure obtained after the formation of the polysilicon film; sequentially etching the first insulating film, the polysilicon film and the gate oxide film using a gate electrode mask, thereby forming a gate electrode and a pattern of the gate oxide film while partially exposing the semiconductor substrate; implanting low concentration impurity ions in the exposed portion of the semiconductor substrate under a condition that the first insulating film is used as a mask; forming insulating film spacers on side walls of the first insulating film and gate electrode; implanting high concentration impurity ions in the exposed portion of the semiconductor substrate under a condition that the upper structure disposed on the semiconductor substrate is used as a mask, thereby forming a source/drain region; forming a pad conductive layer to a desired thickness over the resulting structure obtained after the formation of the source/drain region; forming a second insulating film over the pad conductive layer, thereby planarizing the structure; forming a photoresist film pattern on the second insulating film using a contact mask; etching the second insulating film using the photoresist film pattern as a mask such that the pad conductive layer is partially exposed; removing the photoresist film pattern; selectively growing the exposed portion of the pad conductive layer, thereby forming a second conductive layer; etching the second insulating film using the second conductive layer as a mask, thereby forming a pattern of the second insulating film; etching both the pad conductive layer and the second conductive layer; forming a third insulating film over the resulting structure obtained after the etching of the second conductive layer, thereby planarizing the structure; fully etching the structure planarized by the third insulating film until the second insulating film pattern is exposed, and then planarizing the resulting structure; forming a third conductive layer for a bit line to a desired thickness over the planarized structure; and etching the third conductive layer using a bit line mask, thereby forming a bit line which is in contact with the semiconductor substrate.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1:
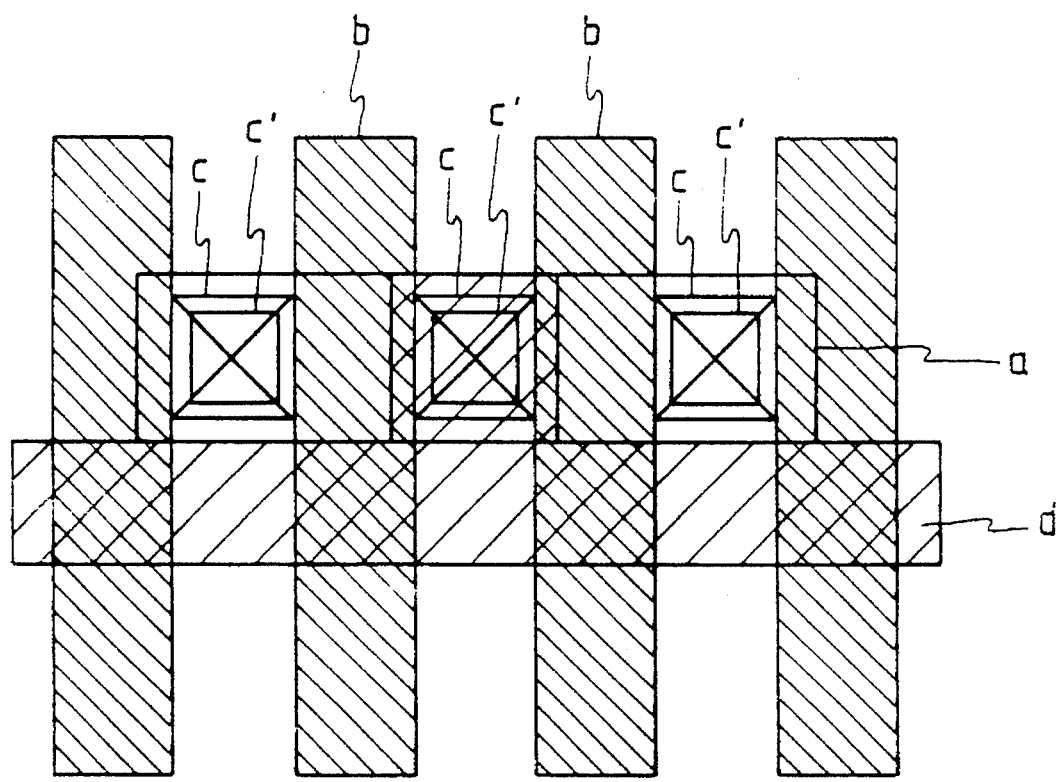
FIG. 1 is a plan view illustrating the layout of masks used in accordance with the present invention.

FIG. 1 is a plan view illustrating the layout of masks for forming a contact between a semiconductor substrate as a first conductive layer and a bit line as a second conductive layer. In FIG. 1, the reference numeral "a" represents an isolation region mask, "b" a gate electrode mask, "c" and "c'" contact hole masks, and "d" a bit line mask. The contact hole mask c has a structure in accordance with the present invention whereas the contact hole mask c' has a conventional structure. It is difficult for the contact hole mask c', which has a dimension smaller than that based on the least design rule, to obtain a desired contact because of the limited resolution of the used equipment. Where the least design rule is made in accordance with the contact hole mask c', the chip area is increased.

FIGS. 2A to 2D are sectional views respectively illustrating sequential steps of a method for forming a micro contact of a semiconductor device in accordance with an embodiment of the present invention.

Figure 2A:
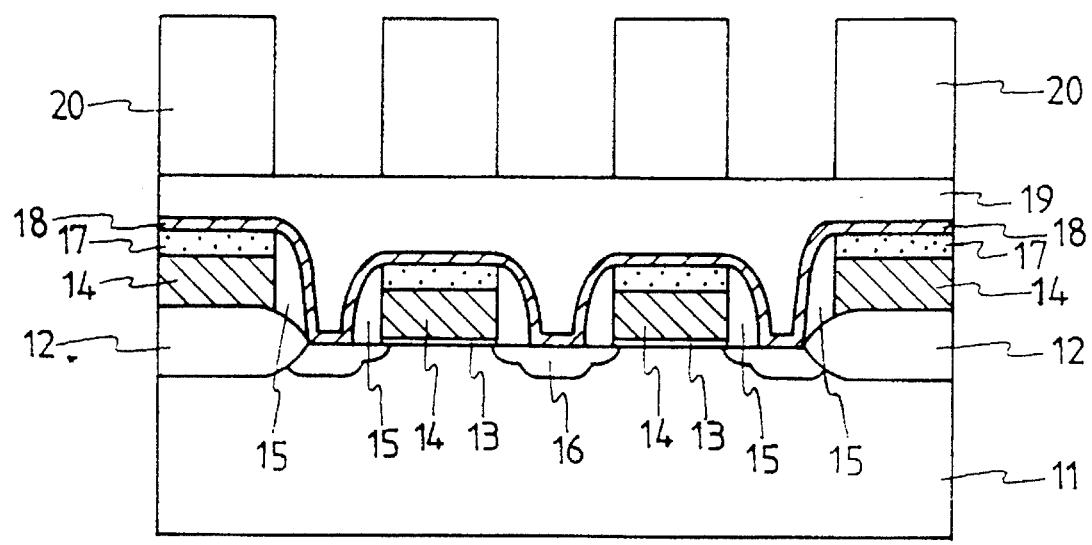
FIGS. 2A to 2D are sectional views respectively illustrating sequential steps of a method for forming micro contacts of a semiconductor device in accordance with an embodiment of the present invention.

In accordance with this method, a semiconductor substrate 11 is prepared as a first conductive layer, on which an element-isolating insulating film 12 is formed, as shown in FIG. 2A. Over the resulting structure, a gate oxide film 13, a polysilicon film for forming a gate electrode, and a first insulating film 17 are sequentially formed. Using a gate electrode mask, the first insulating film 17, the polysilicon film and gate oxide film 13 are etched in a sequential manner, thereby forming gate electrodes. The polysilicon film may be made of polycide. Thereafter, impurity ions are implanted in the semiconductor substrate 11 under the condition that the first insulating film 17 is used as a mask, thereby forming a low concentration impurity-implanted region. Insulating film spacers 15 are then formed on side walls of the first insulating film 17, gate electrodes 14 and gate oxide film 13. Subsequently, high concentration impurity ions are implanted in the low concentration impurity-implanted region, thereby forming a source/drain junction region 16, respectively. Over the resulting structure, a pad polysilicon film 18 is then formed. The pad polysilicon film 18 may be made of polycide. A second insulating film 19 is then formed over the pad polysilicon film 18 to provide a planarized surface. Using a contact mask (not shown), a photoresist film pattern 20 is formed on the second insulating film 19. The contact mask is formed by the least design rule.

Figure 2B:
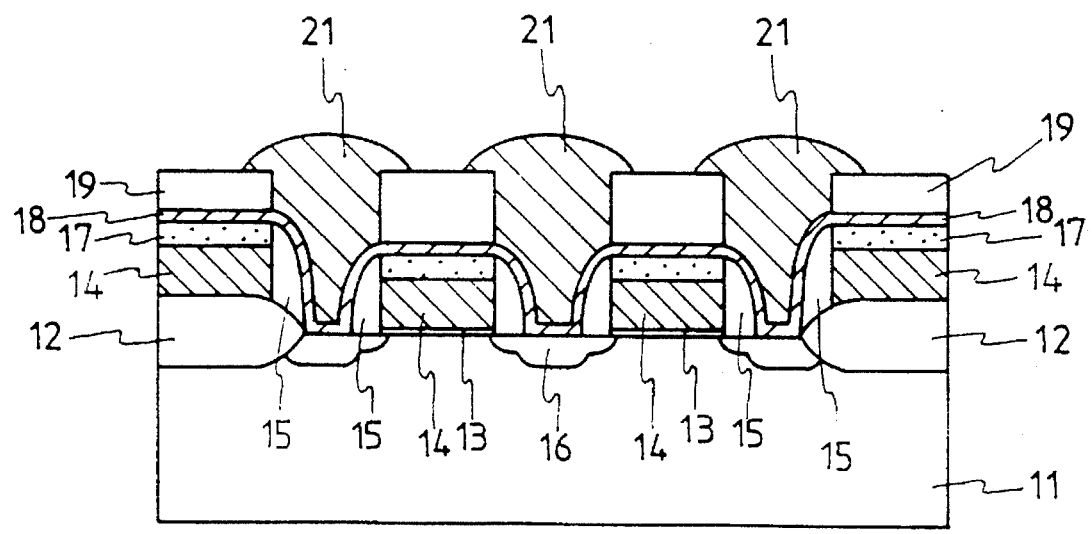

Using the photoresist film pattern 20 as a mask, the second insulating film 19 is then etched such that the pad polysilicon film 18 is exposed, as shown in FIG. 2B. At this etching step, the pad polysilicon film 18 serves as an etch barrier. The exposed portion of pad polysilicon film 18 is then selectively grown, thereby forming a second conductive layer 21. At this time, the second conductive layer 21 is over-grown such that it overlaps with the second insulating film 19 by a certain width.

Figure 2C:
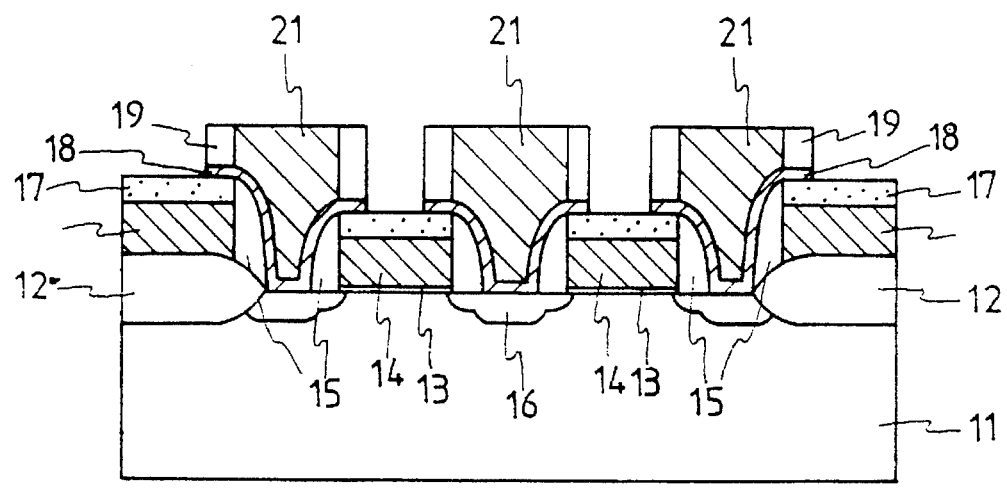

Thereafter, the second insulating film 19 is etched under the condition that the second conductive layer 21 is used as a mask, thereby forming a second insulating film pattern 19' as shown in FIG. 2C. After the formation of the second insulating film pattern 19', the pad polysilicon film 18 is partially exposed. Using the first insulating film 17 and second insulating film pattern 19' as an etch barrier, both the exposed portion of pad polysilicon film 18 and the overgrown second conductive layer 21 are then fully etched.

Figure 2D:
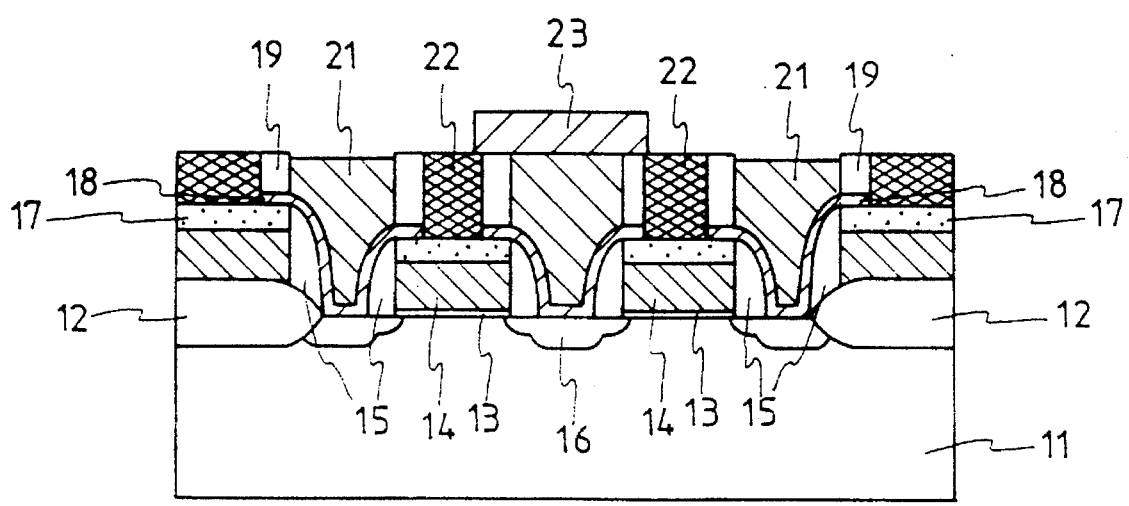

A third insulating film 22 is then formed over the resulting structure obtained after completing the step of FIG. 2C so that the structure can have a planarized surface, as shown in FIG. 2D. The resulting structure is then fully etched until the second insulating film pattern 19' is exposed. Subsequently, a planarization is carried out. Over the planarized surface of the resulting structure, a polysilicon film for forming bit lines is formed as a third conductive layer. Using a bit line mask, the bit line polysilicon film is then etched, thereby forming a bit line 23 which is in contact with the source/drain junction region 16 of the semiconductor substrate 11.

As apparent from the above description, the method according to the present invention can form micro contacts having a dimension smaller than that of an actual dimension of the photoresist film pattern formed in accordance with the least design rule. Accordingly, it is possible to improve the reliability of the semiconductor device and to achieve the high integration of the semiconductor device.

Although the preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method for forming micro contacts of a semiconductor device, comprising the steps of:

forming a gate oxide film on a semiconductor substrate;

forming a polysilicon film for a gate electrode over the gate oxide film;

forming a first insulating film over the resulting structure obtained after the formation of the polysilicon film;

sequentially etching the first insulating film, the polysilicon film and the gate oxide film using a gate electrode mask, thereby forming a gate electrode and a pattern of the gate oxide film while partially exposing the semiconductor substrate;

implanting low concentration impurity ions in the exposed portion of the semiconductor substrate under a condition that the first insulating film is used as a mask;

forming insulating film spacers on side walls of the first insulating film and gate electrode;

implanting high concentration impurity ions in the exposed portion of the semiconductor substrate under a condition that the upper structure disposed on the semiconductor substrate is used as a mask, thereby forming a source/drain region;

forming a pad conductive layer to a desired thickness over the resulting structure obtained after the formation of the source/drain region;

forming a second insulating film over the pad conductive layer, thereby planarizing the structure;

forming a photoresist film pattern on the second insulating film using a contact mask;

etching the second insulating film using the photoresist film pattern as a mask such that the pad conductive layer is partially exposed;

removing the photoresist film pattern;

selectively growing the exposed portion of the pad conductive layer, thereby forming a second conductive layer;

etching the second insulating film using the second conductive layer as a mask, thereby forming a pattern of the second insulating film;

etching both the pad conductive layer and the second conductive layer;

forming a third insulating film over the resulting structure obtained after the etching of the second conductive layer, thereby planarizing the structure;

fully etching the structure planarized by the third insulating film until the second insulating film pattern is exposed, and then planarizing the resulting structure;

forming a third conductive layer for a bit line to a desired thickness over the planarized structure; and etching the third conductive layer using a bit line mask, thereby forming a bit line which is in contact with the semiconductor substrate.

2. The method in accordance with claim 1, wherein the pad conductive layer is made of a material selected from a group consisting of polysilicon and polycide.

3. The method in accordance with claim 1, wherein the second conductive layer is over-grown such that it overlaps with opposite lateral ends of the etched second insulating film.

4. The method in accordance with claim 1, wherein the step of etching the pad conductive layer and the second conductive layer is carried out by a full etch using both the second insulating film pattern and the first insulating film as an etch barrier.

5. The method in accordance with claim 1, wherein the contact size of the semiconductor device is controlled by a thickness of the insulating film spacers.

* * * * *